United States Patent [19]

Jokura

[11] Patent Number: 5,379,002
[45] Date of Patent: Jan. 3, 1995

[54] FREQUENCY SYNTHESIZER USING INTERMITTENTLY CONTROLLED PHASE LOCKED LOOP

[75] Inventor: Jun Jokura, Tokyo, Japan
[73] Assignee: NEC Corporation, Japan
[21] Appl. No.: 84,423
[22] Filed: Jun. 29, 1993
[30] Foreign Application Priority Data
Jun. 29, 1992 [JP] Japan .................................. 4-169765
[51] Int. Cl.$^6$ ............................................. H03L 7/189
[52] U.S. Cl. ........................................ 331/10; 331/14; 331/17; 331/25
[58] Field of Search ........................ 331/10, 14, 17, 25

[56] References Cited

U.S. PATENT DOCUMENTS 4,965,533  10/1990  Gilmore ................................. 331/18
4,977,611  12/1990  Maru ................................. 331/14 X

FOREIGN PATENT DOCUMENTS 0360442  3/1990  European Pat. Off. .
0471502  2/1992  European Pat. Off. .
677298  4/1991  Switzerland .

OTHER PUBLICATIONS

Isao Shimizu, et al., *NTT Review*, "New Digital Mobile Radio Technologies", vol. 4., No. 1, Jan. 1992, Tokyo, Japan, pp. 64–69, XP292915.

*Primary Examiner*—Siegfried H. Grimm
*Attorney, Agent, or Firm*—Ostrolenk, Faber, Gerb & Soffen

[57] ABSTRACT

A control voltage coarse adjustment circuit including a D/A converter voltage generator is provided on a load side of a capacitor in a loop filter included in a phase locked loop. For this structure, a coarsely adjusted voltage is generated to be added to a voltage which is generated by the capacitor of the loop filter for the switch-over of channels during a communication frame. The added voltages are applied to a voltage controlled oscillator to change a frequency for the switch-over of channels. Consequently, the charge and discharge of the capacitor is carried out in a short time to suppress the influence of dielectric absorption current. Thus, the intermittent operation of the phase locked loop in which the phase locked loop is closed and opened intermittently is carried out for the saving of electric power consumption, and a carrier frequency is stabilized in the open phase locked loop by an electric charge voltage of the capacitor in the loop filter.

3 Claims, 3 Drawing Sheets

FREQUENCY SYNTHESIZER USING INTERMITTENTLY CONTROLLED PHASE LOCKED LOOP

FIELD OF THE INVENTION

The invention relates to a frequency synthesizer, and more particularly to, a power saving type of a local oscillation frequency synthesizer to be used in a TDMA (time division multiplexing access) system.

BACKGROUND OF THE INVENTION

In a TDMA system, an adjacent cell is monitored during an idle slot in a communication frame by changing a frequency from a presently used channel to a channel which is considered to be appropriate in the adjacent cell, and the formerly used channel is restored by changing again the frequency. For this purpose, a technology in which the switch-over of oscillation frequencies is carried out with high speed is required in the TDMA system.

A conventional frequency synthesizer used in a TDMA system comprises a reference frequency oscillation unit for generating a reference frequency dependent on a carrier frequency, a voltage controlled oscillator for generating carrier frequency dependent on an applied control voltage, a frequency division circuit for dividing the carrier frequency by a fixed division ratio, a phase comparator for comparing the reference frequency and a divided carrier frequency to provide a phase difference therebetween, a charge pump for charging and discharging a capacitor by receiving the phase difference, and a loop filter having a capacitor to be charged by the charge pump for generating the control voltage to be applied to the voltage controlled oscillator, herein the voltage controlled oscillator, the frequency division circuit, the phase comparator, the charge pump and the loop filter are connected to provide a phase locked loop which is closed and opened by a loop on/off switch.

In operation, the loop on/off switch is turned on, and a power supply voltage is applied to the reference frequency oscillation unit, and the frequency division circuit and the phase comparator in the phase locked loop, so that the voltage controlled oscillator is applied with a control voltage from the loop filter having the capacitor which is charged and discharged dependent on the phase difference detected in the phase comparator by the charge pump. Thus, a controlled carrier frequency is generated in the voltage controlled oscillator. Then, the loop on/off switch is turned off to make the phase locked loop open, and the power supply voltage is not applied to the reference frequency oscillation unit, and the frequency division circuit and the phase comparator in the opened phase locked loop, so that the voltage controlled oscillator is maintained to generate a carrier frequency which is determined by an electric charge voltage of the capacitor in the loop filter. Thus, the phase locked loop is controlled to operate intermittently, thereby realizing the saving of electric power.

In the conventional frequency synthesizer use in a TDMA system, the reference frequency is changed dependent on a controlled carrier frequency obtained in the voltage controlled oscillator, so that the switch-over of channels having a small step width is carried out, while a frequency division ratio of the frequency division circuit is suppressed to be low. Consequently, the switch-over of frequencies is realized with high speed.

However, the conventional frequency synthesizer has a disadvantage in that the loop intermittent operation for the electric power saving is limited to be carried out during a period in which the switch-over of channels is not performed, because the turning-off of the loop on/off switch to provide the loop intermittent operation is difficult to be carried out subsequently to the voltage stabilization of the capacitor in the loop filter under the situation where the switch-over of channels is performed in a TDMA system by a short period. In more detail, the capacitor in the loop filter is frequently charged and discharged at a communication frame, during which synchronism is set up with a separated frequency for the switch-over of channels, by the charge pump. In this situation, the capacitor takes a time in realizing the voltage stabilization due to the occurrence of dielectric absorption current flowing in the capacitor immediately after the charge and discharge thereof.

SUMMARY OF THE INVENTION

Accordingly, it is an object of the invention to provide a frequency synthesizer in which the intermittent operation of a phase locked loop is carried out with a sufficient time at a communication frame.

It is a further object of the invention to provide a frequency synthesizer in which the intermittent operation of a phase locked loop to be carried out at a communication frame is realized without a complicated circuit structure.

According to the invention, a frequency synthesizer, comprises:

a reference signal oscillation unit for providing a reference signal;

a phase locked loop comprising a voltage controlled oscillator for generating a carrier frequency dependent on a control voltage applied thereto, a frequency division circuit for dividing the carrier frequency to provide a divided frequency by a predetermined division ratio, a phase comparator for comparing the reference frequency and the divided frequency to provide a phase difference, a charge pump for applying a charging voltage and a discharging voltage to a nodal point, a loop filter having a capacitor connected to the nodal point for generating the control voltage to be applied to the voltage controlled oscillator, and a loop on/off switch for closing and opening the phase locked loop;

a control unit comprising a power supply control circuit for applying an operative voltage to the phase locked loop which is closed by the loop on/off switch which is turned on intermittently for a switch-over of channels, a closed loop control circuit for controlling the loop on/off switch to be turned on and off in accordance with intermittent operation of the phase locked loop, and a voltage control circuit for controlling and application of a coarsely controlled voltage to the voltage controlled oscillator for the switch-over of channels in a communication frame; and a control voltage coarse adjustment circuit for generating the coarsely controlled voltage to be added to the control voltage of the capacitor in the loop filter by a control of the voltage control circuit.

BRIEF DESCRIPTION OF THE DRAWINGS

The invention will be explained in more detail in conjunction with appended drawings, wherein.

DESCRIPTION OF THE PREFERRED EMBODIMENTS

Figure 1:
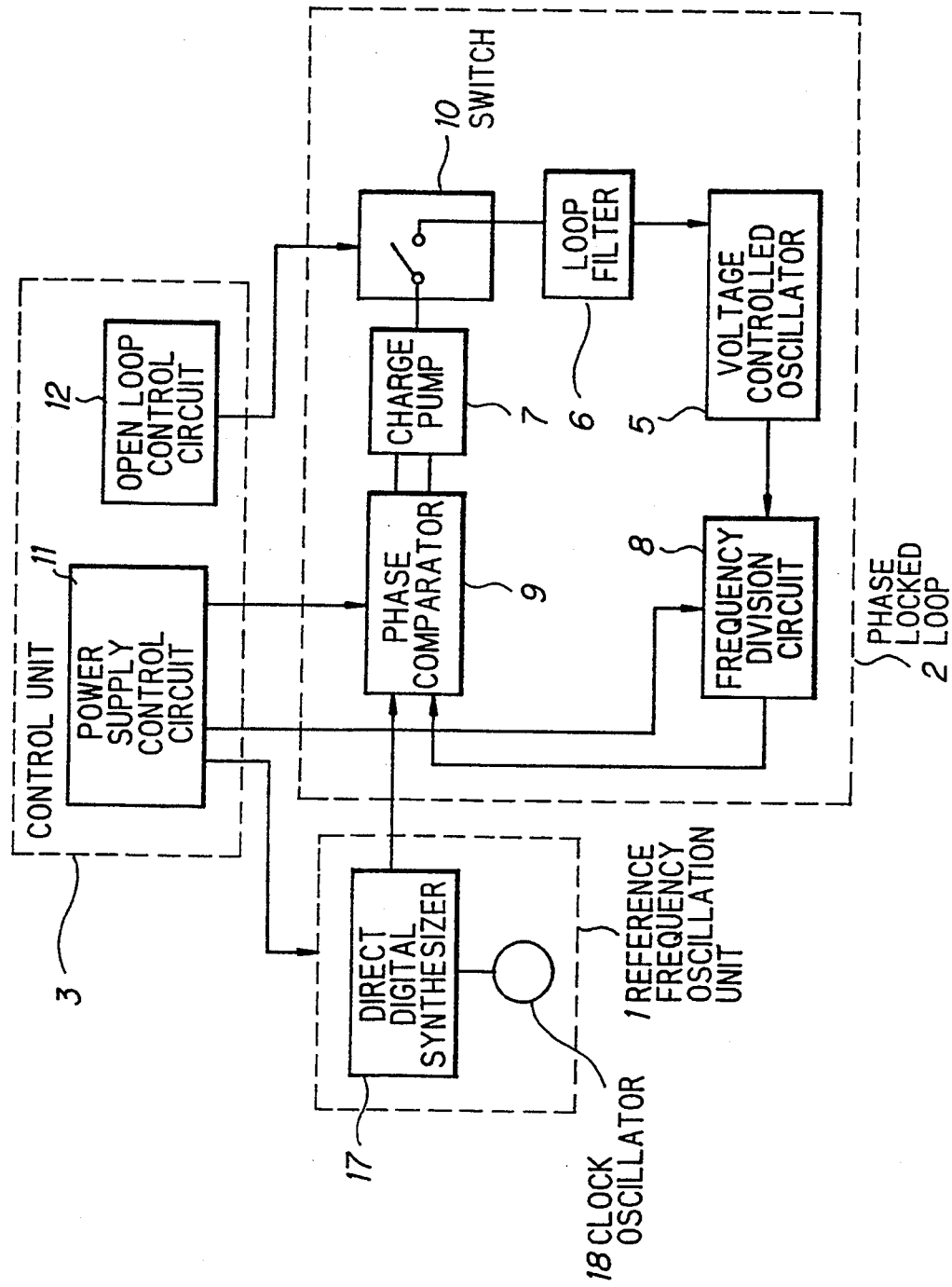
FIG. 1 is a block diagram showing a conventional frequency synthesizer to be used in a TDMA system.

Before explaining a frequency synthesizer in a preferred embodiment according to the invention, the aforementioned conventional frequency synthesizer to be used in a TDMA system will be explained in FIG. 1.

The conventional frequency synthesizer comprises a reference frequency unit 1 for generating a reference frequency, a phase locked loop 2 for equalizing a carrier frequency to the reference frequency, and a control unit 3 for controlling the reference frequency unit 1 and the phase locked loop 2 to operate.

The reference frequency unit 1 comprises a direct digital synthesizer 17 and a clock oscillator 18, wherein a reference frequency which is dependent on a predetermined carrier frequency is digitally obtained in accordance with a fixed clock frequency supplied from the clock oscillator 18 by the direct digital synthesizer 17.

The phase locked loop 2 comprises a voltage controlled oscillator 5 for generating a carrier frequency dependent on applied control voltage, a loop filter 6 having a capacitor for generating a control voltage to be applied to the voltage controlled oscillator 5, a charge pump 7 for charging the capacitor in the loop filter 6 by receiving a phase difference between the reference frequency and a divided frequency of the carrier frequency, a frequency division circuit 8 for providing the divided frequency of the carrier frequency, a phase comparator 9 for providing the charge pump 7 with the phase difference, and a loop on/off switch 10 for closing and opening the phase locked loop 2.

The control unit 3 comprises a voltage control circuit 11 for applying a power supply voltage to the reference frequency unit 1, and the frequency division circuit 8 and the phase comparator 9 in the phase locked loop 2 when the phase locked loop 2 is closed for the phase locking operation, and an open loop control circuit 12 for closing and opening the phase locked loop 2 intermittently in synchronism with the intermittent application of the power supply voltage by the voltage control circuit 11.

Operation and a disadvantage of the conventional frequency synthesizer have been formerly explained. Therefore, the explanation thereof is not made here.

Next, a frequency synthesizer in the preferred embodiment according to the invention will be explained in FIGS. 2 to 4, wherein like parts are indicated by like reference numerals as used in FIG. 1.

Figure 2:
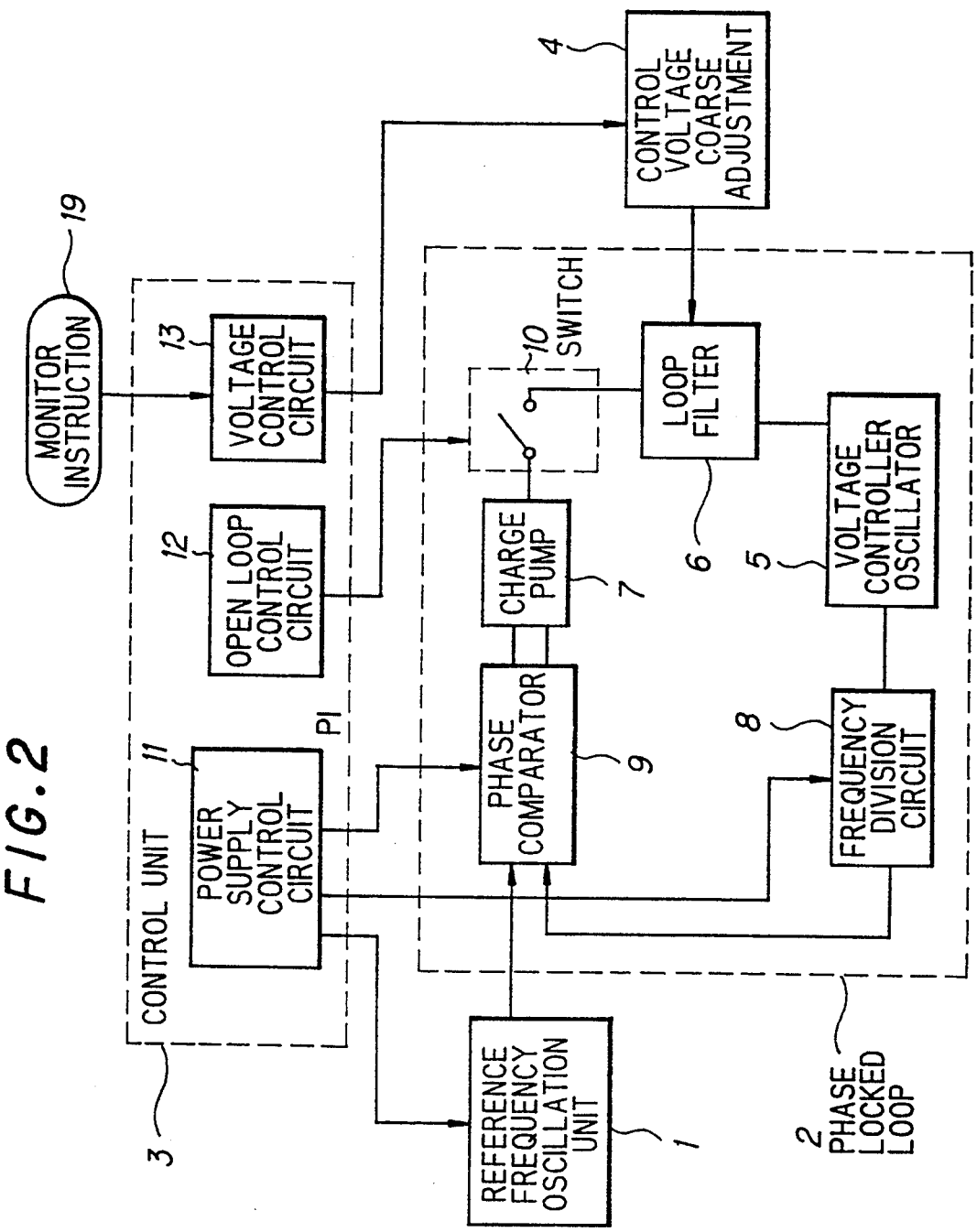
FIG. 2 is a block diagram showing a frequency synthesizer in a preferred embodiment according to the invention.
Figure 3:
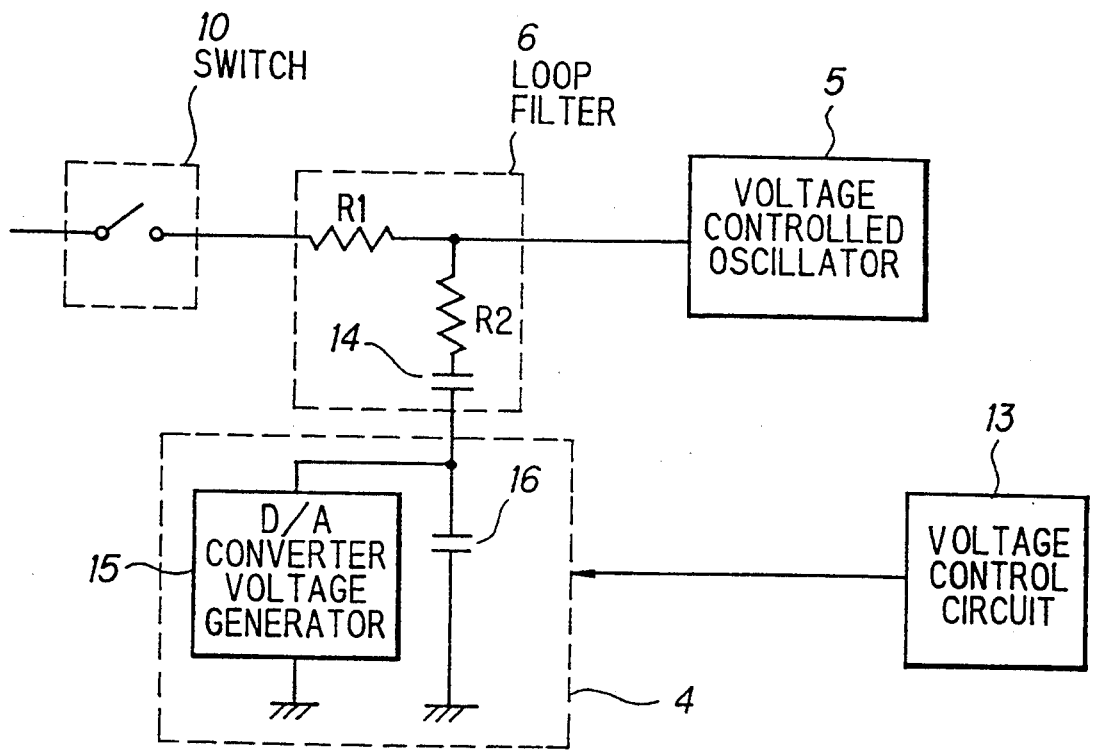
FIG. 3 is a block diagram showing a voltage control circuit for a loop filter in the preferred embodiment.

In FIGS. 2 and 3, there is added to the conventional frequency synthesizer a control voltage coarse adjustment circuit 4 comprising a D/A converter-voltage generator 15 for generating a coarse-adjustment voltage and a capacitor 16 connected in parallel between a capacitor 14 of the loop filter 6 and ground, wherein the Loop filter 6 comprises the capacitor 14 and resistors R1 and R2, and the control unit 3 comprises a voltage control circuit 13 for controlling the control voltage coarse adjustment circuit 4 by receiving a monitor instruction 19 additionally to the conventional structure.

Figure 4:
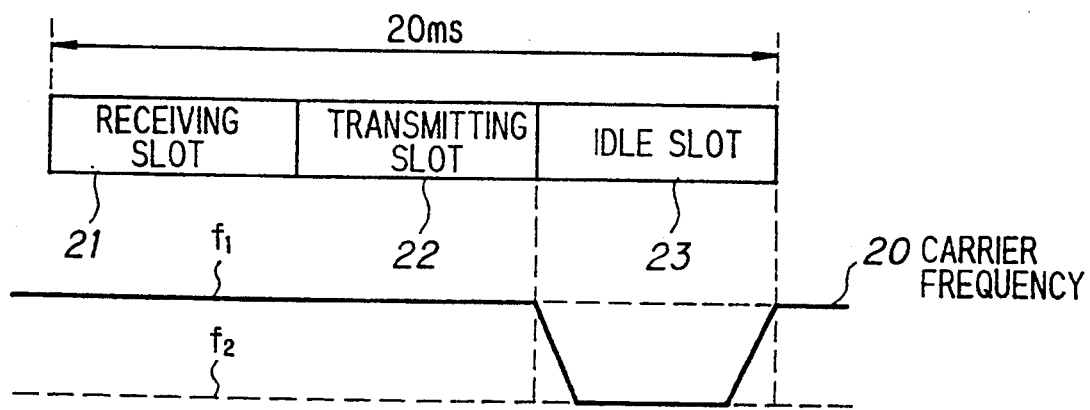
FIG. 4 is an explanatory diagram showing a relation between a communication frame in a TDMA system and an oscillation frequency required in the preferred embodiment.

FIG. 4 shows a communication frame of 20 ms in a TDM3 system comprising a receiving slot 21, a transmitting slot 22 and an idle slot 23. In the idle slot 23, a carrier frequency 20 is changed from a frequency $f_1$ for a channel presently used for a communication including the receiving slot 21 and the transmitting slot 22 to a frequency $f_2$ for a channel to be considered appropriate in an adjacent cell. Then, when the carrier frequency $f_2$ is not appropriate for a communication as a result of monitoring the adjacent cell, the carrier frequency $f_2$ is restored for the subsequent communication. Only in such cases as changing the carrier frequencies $f_1$ and $f_2$, a phase lock loop is closed, and a power supply voltage is applied thereto. On the other hand, when it is not necessary to change a carrier frequency, that is, a carrier frequency set up by an electric charge voltage of the capacitor 14 in the loop filter 6 and a voltage of the D/A converter voltage generator 15 is maintained, no power supply voltage is applied to the phase locked loop 2 which is opened by the loop on/off switch 10.

Thus, the intermittent operation is realized to save electric power consumption.

In operation, a carrier frequency of the voltage controlled oscillator of is maintained by a voltage obtained in the addition of an electric charge voltage of the capacitor 14 in the loop filter 6 and a voltage of the D/A converter voltage generator 15 in accordance with the control of the voltage control circuit 13, under the situation where the synchronism is set up with a predetermined carrier frequency of a communication channel.

Here, when the voltage control circuit 13 receives a monitor instruction 19, by which the carrier frequency is changed to a carrier frequency of an adjacent cell at the idle slot 23 in the communication frame to check a receiving sensitivity of the adjacent cell, the voltage control circuit 13 controls the control voltage coarse adjustment circuit 4 to change a voltage of the D/A converter voltage generator 15 by a changing amount of $\Delta V$ which is defined below.

$$\Delta V = \alpha \times (f_1 - f_2)$$

Where $f_1$ is a frequency of a presently used communication channel, $f_2$ is a frequency of a channel to be monitored, and $\alpha$ is a modulation sensitivity.

Thus, a voltage applied to the voltage controlled oscillator 5 by the loop filter 6 is coarsely adjusted by the control voltage coarse adjustment circuit 13, and a finely controlled voltage is applied from the loop filter 6 to the voltage controlled oscillator 5 by a phase difference of the phase comparator 9. Consequently, the intermittent operation of the phase locked loop becomes possible to be carried out for the electric power saving, because the capacitor 14 of the loop filter 16 becomes stabilized in a short time even during a remaining short period at the communication frame after the setting-up of synchronism with a carrier frequency The changing amount of the capacitor 16 in the control voltage coarse adjustment circuit 13 is small in an electric charge voltage between before and after the switch-over of channels, so that the influence of dielectric absorption current becomes negligible in the preferred embodiment. Therefore, a control voltage applied to the voltage controlled oscillator 5 becomes stabilized in a time sufficiently shorter than that in the conventional frequency synthesizer, so that an electric charge voltage is maintained without transient change, even if the loop on/off switch 10 is turned off to make the phase locked loop open. Consequently, a carrier frequency obtained by the voltage controlled oscillator 5 is maintained to be a predetermined value in cooperation with a voltage of the D/A converter voltage generator 15 in the intermittent operation of the phase locked loop 2.

After the adjacent cell is monitored, the frequency is changed back to a carrier frequency for the communication channel in the state where the loop on/off switch 10 is turned on to make the phase locked loop 2 close. For this purpose, an output voltage of the D/A converter voltage generator 15 is coarsely changed to comply with a communical channel by the control voltage-coarse adjustment circuit 13, and a voltage of the capacitor 14 is finely changed to provide the setting-up of synchronism with a carrier frequency of the communication channel by the charge pump 7 receiving a phase difference from the phase comparator 9.

Although the invention has been described with respect to a specific embodiment for complete and clear disclosure, the appended claims are not to be thus limited but are to be construed as embodying all modifications and alternative constructions that may occur to one skilled in the art which fairly fall within the basic teaching herein set forth.

What is claimed is
1. A frequency synthesizer, comprising:
   a reference signal oscillation unit for providing a reference signal;
   a phase locked loop comprising a voltage controlled oscillator for generating a carrier frequency dependent on a control voltage applied thereto, a frequency division circuit for dividing said carrier frequency to provide a divided frequency by a predetermined division ratio, a phase comparator for comparing said reference frequency and said divided frequency to provide a phase difference, a charge pump for applying a charging voltage and a discharging voltage to a nodal point, a loop filter having a capacitor connected to said nodal point for generating said control voltage to be applied to said voltage controlled oscillator, and a loop on/off switch for closing and opening said phase locked loop;
   a control unit comprising a power supply control circuit for applying an operative voltage to said phase locked loop which is closed by said loop on/off switch which is turned on intermittently for a switch-over of channels, an open loop control circuit for controlling said loop on/off switch to be turned on and off in accordance with intermittent operation of said phase locked loop, and a selectively operable voltage control circuit for controlling an application of a coarsely controlled voltage to said voltage controlled oscillator for said switch-over of channels in a communication frame, said coarsely controlled voltage being proportional to a difference between frequencies of channels for said switch-over; and
   a control voltage coarse adjustment circuit for generating said coarsely controlled voltage to be added to said control voltage of said capacitor in said loop filter by a control of said voltage control circuit.

2. A frequency synthesizer, according to claim 1, wherein;
   said loop on/off switch is positioned at said nodal point.

3. A frequency synthesizer, according to claim 1, wherein;
   said control voltage coarse adjustment circuit comprises a D/A converter voltage generator and a capacitor in parallel connected between a negative terminal of said capacitor in said loop filter and ground, said D/A converter voltage generator controlled to receive a digital value to generate said coarsely controlled voltage by said voltage control circuit.

* * * * *